(12) United States Patent
Senga

(10) Patent No.: US 8,139,147 B2
(45) Date of Patent: Mar. 20, 2012

(54) IMAGE SENSOR

(75) Inventor: Shotaro Senga, Daito (JP)

(73) Assignee: Funai Electric, Co., Ltd., Daito-shi (JP)

( * ) Notice: Subject to any disclaimer, the term of this patent is extended or adjusted under 35 U.S.C. 154(b) by 568 days.

(21) Appl. No.: 12/358,668

(22) Filed: Jan. 23, 2009

(65) Prior Publication Data

US 2009/0201399 A1    Aug. 13, 2009

(30) Foreign Application Priority Data

Feb. 7, 2008 (JP) .................................. 2008-27266

(51) Int. Cl.
H04N 5/225 (2006.01)
H04N 5/335 (2011.01)

(52) U.S. Cl. ........................ 348/374; 348/294; 348/375

(58) Field of Classification Search ........................ None
See application file for complete search history.

(56) References Cited

U.S. PATENT DOCUMENTS

| 5,740,482 | A * | 4/1998 | Inazuka | 396/296 |
| 6,966,482 | B2 * | 11/2005 | Totani et al. | 228/215 |
| 7,505,677 | B2 * | 3/2009 | Kim et al. | 396/55 |
| 7,586,519 | B2 * | 9/2009 | Nomura et al. | 348/208.4 |
| 7,613,390 | B2 * | 11/2009 | Nomura et al. | 396/542 |
| 2007/0019076 | A1 | 1/2007 | Teramoto et al. | |

FOREIGN PATENT DOCUMENTS

| JP | 8-116140 A | 5/1996 |
| JP | 2005-302879 A | 10/2005 |
| JP | 2007-43129 A | 2/2007 |

* cited by examiner

Primary Examiner — Luong T Nguyen
(74) Attorney, Agent, or Firm — Crowell & Moring LLP

(57) ABSTRACT

An image sensor includes an imaging element for imaging an object, a movable member mounted with the imaging element and movably provided, a flexible printed circuit board having a portion on a side of a first end connected to the imaging element, and including a visually recognizable positioning member provided at least on a side of an upper surface and an extension/contraction region formed by folding the flexible printed circuit board with reference to the positioning member, and a circuit board connected with a portion on a side of a second end of the flexible printed circuit board and fixedly set.

18 Claims, 9 Drawing Sheets

IMAGE SENSOR

BACKGROUND OF THE INVENTION

1. Field of the Invention

The present invention relates to an image sensor, and more particularly to an image sensor comprising a flexible printed circuit board.

2. Description of the Background Art

An image sensor comprising a flexible printed circuit board is known in general, as disclosed in each of Japanese Patent Laying-Open Nos. 8-116140, 2005-302879 and 2007-43129, for example.

The aforementioned Japanese Patent Laying-Open No. 8-116140 discloses a flexible printed circuit board, in which a prescribed wiring is formed on an upper surface of a base film, copper foil is provided on an overall lower surface of the base film, and the copper foil only on a portion to be folded (folded portion) is thereafter removed. This flexible printed circuit board can be easily folded on the folded portion provided with no copper foil by applying folding stress from both ends of the flexible printed circuit board.

The aforementioned Japanese Patent Laying-Open No. 2005-302879 discloses a flexible printed circuit board including a deformable insulating substrate having a wiring pattern made of copper on at least a first surface and a reinforcing conductive layer which is made of metal softer than copper and provided on an overall region of a repeatedly folded portion in the wiring pattern. In this flexible printed circuit board, stress by folding is dispersed in the reinforcing conductive layer and a conductive path is compensated by the reinforcing conductive layer also when the wiring pattern is disconnected.

The aforementioned Japanese Patent Laying-Open No. 2007-43129 discloses an image sensor comprising an imaging element, a movable moving member (movable member), a movable flexible printed circuit board fixed on a fixed member (circuit board) and having looseness (extension/contraction region) held between folded portions, in which a slit is provided parallel to a direction of movement of the flexible printed circuit board on the flexible printed circuit board. In this image sensor, load resistance caused by deformation of the flexible printed circuit board can be reduced by the slit even when looseness is small, and hence a camera shake correction function and an image sensor having the camera shake correction function can be downsized and reduce power consumption.

In the flexible printed circuit board described in the aforementioned Japanese Patent Laying-Open No. 8-116140, however, only the wiring can be visually recognized from a side of the upper surface and the folded portion can not be visually recognized from the side of the upper surface, and hence it is conceivable that the flexible printed circuit board is disadvantageously folded at an undesirable folded position or angle. Thus, when an extension/contraction region is provided by folding the flexible printed circuit board, the extension/contraction region of the flexible printed circuit board is not properly provided and hence a movable region of the flexible printed circuit board is not properly ensured. Consequently, it is conceivable that camera shake correction is not disadvantageously properly performed in the image sensor comprising the flexible printed circuit board.

In the flexible printed circuit board described in the aforementioned Japanese Patent Laying-Open No. 2005-302879, the reinforcing conductive layer are provided on the overall region of the folded portion and the extension/contraction region of the flexible printed circuit board when the extension/contraction region is provided by folding the flexible printed circuit board. Thus, it is difficult to visually distinguish between the extension/contraction region and the folded portion, and hence it is conceivable that the flexible printed circuit board is disadvantageously folded at an undesirable folded position or angle. Thus, the extension/contraction region of the flexible printed circuit board is not properly provided and hence a movable region of the flexible printed circuit board is not properly ensured. Consequently, it is conceivable that camera shake correction is not disadvantageously properly performed in the image sensor comprising the flexible printed circuit board.

In the image sensor described in the aforementioned Japanese Patent Laying-Open No. 2007-43129, no component is provided at a folded position of the flexible printed circuit board and the folded position can not be visually recognized, and hence and hence it is conceivable that the flexible printed circuit board is disadvantageously folded at an undesirable folded position or angle. Thus, the extension/contraction region of the flexible printed circuit board is not properly provided and hence a movable region of the flexible printed circuit board is not properly ensured. Consequently, it is conceivable that camera shake correction is not disadvantageously properly performed in the image sensor comprising the flexible printed circuit board.

SUMMARY OF THE INVENTION

The present invention has been proposed in order to solve the aforementioned problems, and an object of the present invention is to provide an image sensor comprising a flexible printed circuit board in which a folded portion can be easily positioned, so that a movable region of the flexible printed circuit board can be properly secured and camera shake correction can be properly performed.

An image sensor according to an aspect of the present invention comprises an imaging element for imaging an object, a movable member mounted with the imaging element and movably provided, a flexible printed circuit board having a portion on a side of a first end connected to the imaging element, and including a visually recognizable positioning member provided at least on a side of an upper surface and an extension/contraction region formed by folding the flexible printed circuit board with reference to the positioning member and a circuit board connected with a portion on a side of a second end of the flexible printed circuit board and fixedly set.

In the image sensor according to the aspect of this invention, as hereinabove described, the image sensor comprises the flexible printed circuit board including the visually recognizable positioning member provided at least on the side of the upper surface and the extension/contraction region formed by folding the flexible printed circuit board with reference to the positioning member, whereby the flexible printed circuit board can be folded with reference to the visually recognizable positioning member and hence a folded portion can be easily positioned. Thus, the movable region of the flexible printed circuit board can be properly secured and hence camera shake correction can be properly performed.

In the image sensor according to the aforementioned aspect, the positioning member is preferably so provided as to extend in a direction perpendicular to an extension/contraction direction of the extension/contraction region in plan view. According to this structure, the flexible printed circuit board is folded with reference to the positioning member, whereby a folded portion can be so provided as to extend in the direction perpendicular to the extension/contraction direction. Thus, the extension/contraction region of the flexible printed circuit board can be extended/contracted only in a movement direction of the flexible printed circuit board. Thus, the extension/contraction region of the flexible printed circuit board is extended/contracted only in a movement direction of the movable member, whereby the flexible printed circuit board can be moved only in the extension/contraction direction and hence camera shake correction can be further properly performed.

In the image sensor according to the aforementioned aspect, the positioning member is preferably so provided as to extend over a region between a portion around a first side surface of the flexible printed circuit board and a portion around a second side surface thereof. According to this structure, the positioning member is substantially entirely provided adjacent to a folded portion, and hence the flexible printed circuit board can be further easily folded with reference to the positioning member. Consequently, the folded portion of the flexible printed circuit board can be further easily positioned.

In the image sensor according to the aforementioned aspect, the positioning member is preferably formed by the same layer as a wire of the flexible printed circuit board. According to this structure, the wire of the flexible printed circuit board is provided when fabricating the flexible printed circuit board, while the positioning member is also simultaneously provided.

In this case, the flexible printed circuit board preferably includes a terminal connecting wire portion connected to a terminal of the imaging element and having an exposed surface, and the positioning member is preferably formed by the same layer as the terminal connecting wire portion. According to this structure, the terminal connecting wire portion is provided when fabricating the flexible printed circuit board, while the positioning member is also simultaneously provided.

In the aforementioned structure in which the positioning member is formed by the same layer as the wire, the positioning member is preferably made of metal foil. According to this structure, the positioning member can be easily formed by the same layer as the wire by leaving a conductive layer on a location where the positioning member is formed when the conductive layer made of metal foil which is previously provided is etched to form the wire.

In the aforementioned structure in which the positioning member is made of metal foil, the positioning member is preferably made of copper foil. According to this structure, the wire and a signal line of the flexible printed circuit board are generally made of copper foil and hence the positioning member can be easily formed by leaving a conductive layer on a location where the positioning member is formed when the conductive layer made of copper foil which is previously provided is etched to form the wire.

In the image sensor according to the aforementioned aspect, the positioning member is preferably provided on one side of the flexible printed circuit board. According to this structure, a signal line of the flexible printed circuit board can be provided on a position, corresponding to the positioning member, of a surface on a side opposite to the one side on which the positioning member is provided, and hence the folded portion can be positioned without damaging a wire function of the flexible printed circuit board.

In the image sensor according to the aforementioned aspect, the positioning member preferably includes a first positioning member provided on an end of the extension/contraction region corresponding to the portion on the side of the first end of the flexible printed circuit board connected to the imaging element and a second positioning member provided on an end of the extension/contraction region corresponding to the portion on the side of the second end of the flexible printed circuit board connected to the circuit board. According to this structure, the both end of the extension/contraction region where the first positioning member and the second positioning member are located respectively are folded, whereby the extension/contraction region of the flexible printed circuit board can be further apparent. Thus, the movable region of the flexible printed circuit board can be further properly secured.

In the aforementioned structure in which the positioning member includes the first positioning member and the second positioning member, the first positioning member and the second positioning member are preferably so formed as to extend in a direction substantially perpendicular to an extension/contraction direction of the extension/contraction region, and a width of the first positioning member is preferably rendered larger than that of the second positioning member. According to this structure, folded positions in forming the extension/contraction region can be easily confirmed due to difference in widths between the first positioning member and the second positioning member. The width of the first positioning member is increased so that intensity of the first positioning member is increased, and hence the flexible printed circuit board can be easily correctly folded even when a pair of the first positioning members are so formed as to hold the slit therebetween.

In the aforementioned structure in which the positioning member includes the first positioning member and the second positioning member, the flexible printed circuit board preferably further has a slit, and the slit is preferably so provided on at least the extension/contraction region which is folded as to extend along an extension/contraction direction of the extension/contraction region. According to this structure, a load resistance in extending/contracting the extension/contraction region of the flexible printed circuit board can be reduced, and hence reduction in a reaction rate of the camera shake correction can be suppressed.

In this case, the slit is preferably so formed at a substantially central portion of the flexible printed circuit board in a direction perpendicular to the extension/contraction direction of the extension/contraction region as to extend along the extension/contraction direction of the extension/contraction region. According to this structure, the extension/contraction region of the flexible printed circuit board can be inhibited from extension/contraction in a state of being displaced from a direction of movement of the movable member dissimilarly to a case where the slit is formed on a side of a one-sided side surface in the direction perpendicular to the extension/contraction direction of the flexible printed circuit board.

In the aforementioned structure in which the flexible printed circuit board has the slit, a pair of the first positioning members are preferably so formed as to hold the slit therebetween. According to this structure, the flexible printed circuit board can be reliably folded by the pair of first positioning members also when the slit is provided.

In the aforementioned structure in which the flexible printed circuit board has the slit, the slit is preferably so formed as to extend from the extension/contraction region to a region other than the extension/contraction region. According to this structure, a load resistance following to the deformation -in extension/contraction of the flexible printed circuit board can be further reduced.

In this case, the slit is preferably so formed as to extend from the extension/contraction region of the flexible printed circuit board to a region of the flexible printed circuit board on a side opposite to the extension/contraction region with respect to the first positioning member. According to this structure, the portion on the side of the first end of the flexible printed circuit board connected to the imaging element is moved in the extension/contraction direction by extension/contraction of the extension/contraction region as compared with the portion on the side of the second end of the flexible printed circuit board connected to the fixed circuit board, and hence a load resistance following to the deformation in extension/contraction of the flexible printed circuit board can be further reduced.

In the image sensor according to the aforementioned aspect, the extension/contraction region is preferably formed in a substantially V-shape as viewed from a side surface of the flexible printed circuit board, and the positioning member is preferably provided on each of both ends of the substantially V-shaped extension/contraction region. According to this structure, a load resistance in extending/contracting the extension/contraction region formed in a substantially triangular shape (substantially V-shape) as viewed from the side surface can be reduced as compared with a case of an extension/contraction region formed in a substantially square shape as viewed from the side surface, and hence reduction in a reaction rate of camera shake correction can be suppressed.

In the image sensor according to the aforementioned aspect, the positioning member is preferably so formed as to be in contact with an end of the extension/contraction region and to be located outside the extension/contraction region. According to this structure, a load resistance in extending/contracting the extension/contraction region of the flexible printed circuit board can be inhibited from increase due to formation of the positioning member in the extension/contraction region.

In the image sensor according to the aforementioned aspect, the flexible printed circuit board preferably further includes a protective film which is formed on a surface of the flexible printed circuit board so as to cover the positioning member and through which the positioning member is visually recognized. According to this structure, the positioning member can be visually recognized due to the protective film through which the positioning member is visually recognized, and the positioning member and the wire and the like inside the flexible printed circuit board can be reliably protected from external environment.

In the aforementioned structure in which the flexible printed circuit board includes the protective film, the protective film is preferably made of polyimide. According to this structure, polyimide has light transmissibility and insulation properties, and hence the positioning member and the wire and the like inside the flexible printed circuit board can be protected from external environment and insulation between the positioning member and the wire and the like inside the flexible printed circuit board can be kept.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the accompanying drawings.

A structure of a video camera 10 according to the embodiment of the present invention will be now described with reference to FIGS. 1 to 13. This embodiment of the present invention is applied to the video camera 10, which is an exemplary image sensor.

Figure 1:
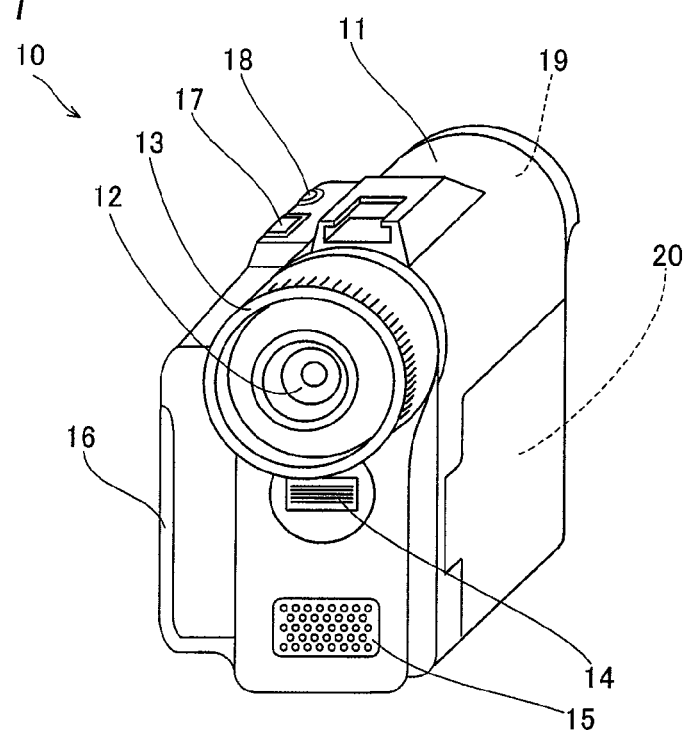
FIG. 1 is a perspective view showing an overall structure of a video camera according to an embodiment of the present invention.
Figure 2:
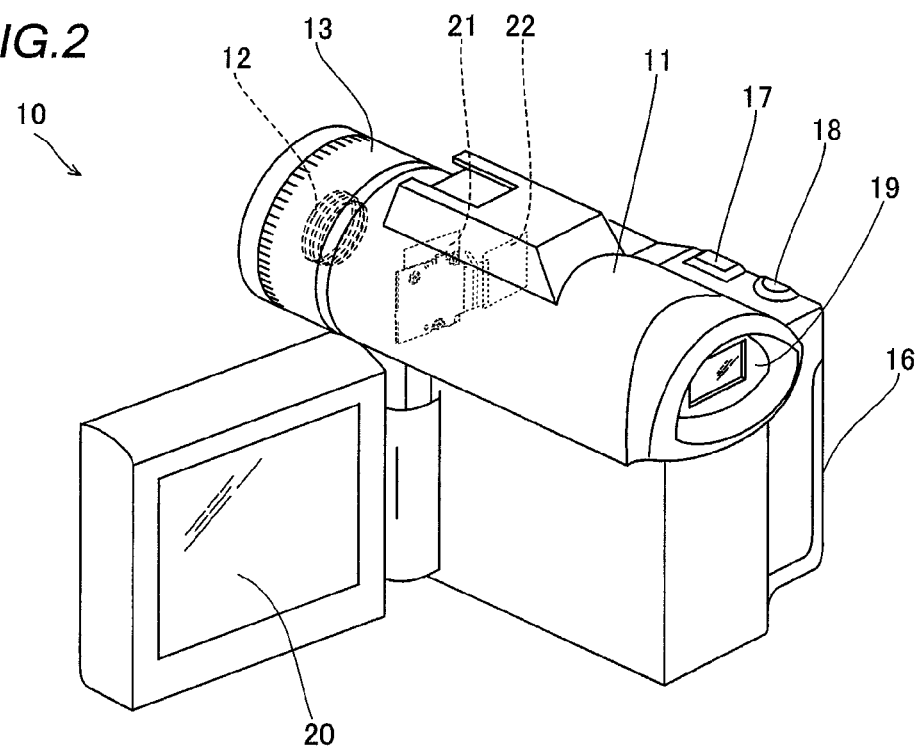
FIG. 2 is another perspective view showing the overall structure of the video camera according to the embodiment of the present invention.

In the video camera 10 according to the embodiment of the present invention, a lens barrel 13 storing a plurality of optical lenses 12 therein, a stroboscope 14, a built-in microphone 15, a video cassette portion 16 on which a video tape (not shown) is detachably mounted, a recording/reproducing button 17 used for recording images, a photo button 18 used for recording still images, a finder 19, a liquid crystal monitor 20 capable of displaying recorded images on a screen, an imaging portion 21 and a circuit board 22 are provided on a housing 11 made of resin, as shown in FIGS. 1 and 2.

As shown in FIGS. 1 and 2, the lens barrel 13 storing the plurality of optical lenses 12 therein is so formed as to horizontally project outward from a front surface side of the housing 11. The stroboscope 14 has a function of emitting light as auxiliary light in imaging. The built-in microphone 15 has a function of collecting sounds around an object in imaging (recording). The recording/reproducing button 17 has a function of starting an operation of recording images picked up by the imaging portion 21 of the video camera 10 in the video tape (not shown) by being pressed by the user in imaging and of stopping the recording in the video tape (not shown) in completion of the recording. The photo button 18 is so pressed by the user in imaging as to record images currently picked up by the imaging portion 21 as still images. The liquid crystal monitor 20 openable from the finder 19 and the housing 11 in a closable manner is so formed that the user can decide the range of imaging while observing the object through either one or both of the finder 19 and the liquid crystal monitor 20.

Figure 5:
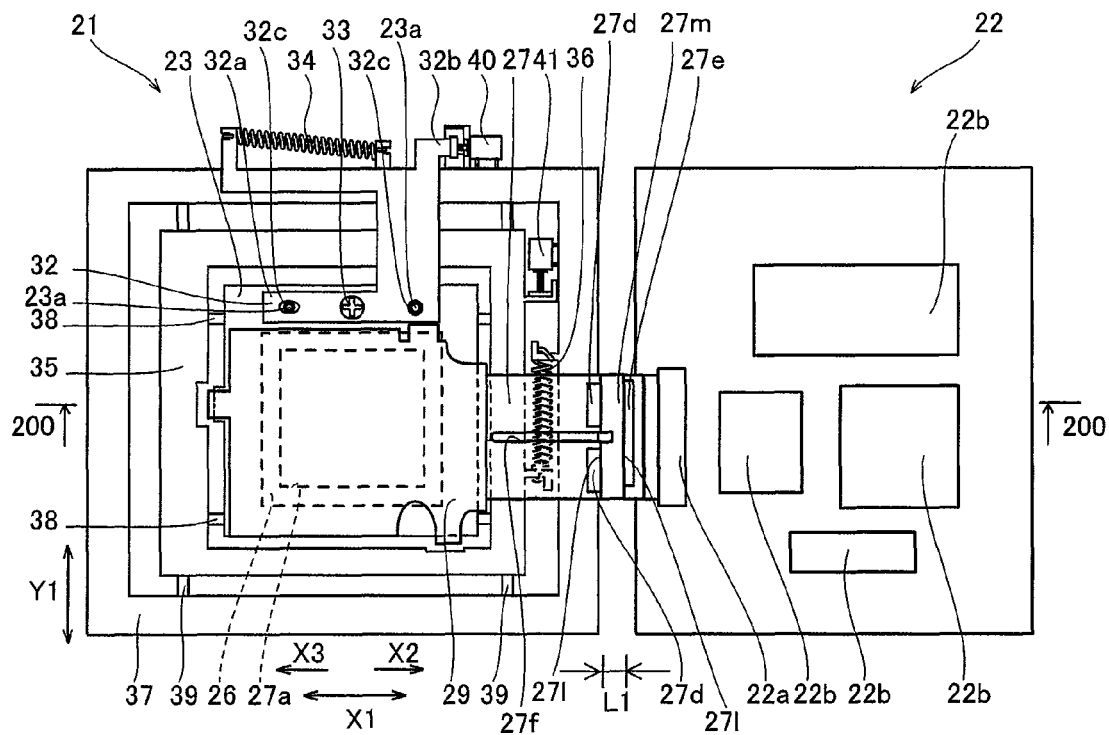
FIG. 5 is a plan view showing the imaging portion mounted with the circuit board through the FPC according to the embodiment of the present invention.
Figure 6:
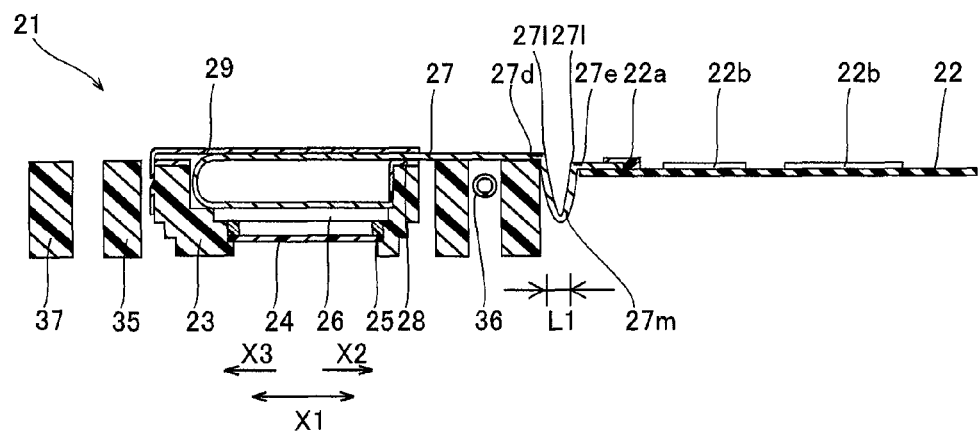
FIG. 6 is a sectional view taken along the line 200-200 in FIG. 5, showing the imaging portion mounted with the circuit board through the FPC according to the embodiment of the present invention.

As shown in FIGS. 5 and 6, the circuit board 22 has a connector 22a connected with a connecting terminal portion 27h of an FPC 27 described later and integrated circuits 22b performing processing of received image signals, and is fixedly provided on the video camera 10.

As shown in FIGS. 3 to 6, the imaging portion 21 of the video camera 10 includes an X-Y stage 23 made of resin movable only along arrow X1, a lens member 24 made of glass, a packing member 25 made of rubber or the like, a CCD (charge coupled device) 26 for imaging the object, a flexible printed circuit board (FPC) 27, a holding member 28 for holding the FPC 27, a pressing plate 29 made of sheet metal, a screw member 30 for fixing the FPC 27 and the holding member 28 to the X-Y stage 23 and a screw member 31 for fixing the holding member 28 to the X-Y stage 23.

The imaging portion 21 of the video camera 10 is further provided with a transmission arm member 32 made of sheet metal, a screw member 33 for fixing the transmission arm member 32 and the X-Y stage 23, a spring 34 for urging the X-Y stage 23 along arrow X1, a Y stage 35 made of resin movable along arrow Y1, a spring 36 for urging the Y stage 35 along arrow Y1, a fixed member 37 made of resin, pair of shafts 38 fixed to the Y stage 35, a pair of shafts 39 fixed to the fixed member 37, a stepping motor 40 mounted on the transmission arm member 32 and a stepping motor 41 mounted on the fixed member 37 and moving the Y stage 35 along arrow Y1, as shown in FIGS. 3 to 6. The X-Y stage 23 and the CCD 26 are examples of the "movable member" and the "imaging element" in the present invention respectively.

The X-Y stage 23 of the imaging portion 21 has positioning boss portions 23a for positioning the transmission arm member 32, a lens member mounting surface 23b, a CCD mounting surface 23c, a screw hole 23d corresponding to a screw member 30, a screw hole 23e corresponding to the screw member 31 and pawls 23f engaging with engaging holes 29a of the pressing plate 29 described later, as shown in FIGS. 3 to 6. The positioning boss portions 23a are provided integrally with the X-Y stage 23 extending vertically upward from an upper surface of the X-Y stage 23. The lens member mounting surface 23b and the CCD mounting surface 23c are so formed that the lens member 24 and the CCD 26 are mounted thereon in contact therewith respectively. As shown in FIGS. 5 and 6, the X-Y stage 23 is so formed that a central portion of the X-Y stage 23 is positioned substantially at a central portion of the imaging portion 21 and the shafts 38 are inserted movable along arrow X1 in the vicinity of both ends along arrow Y1 when no displacement is applied to the X-Y stage 23.

Figure 4:
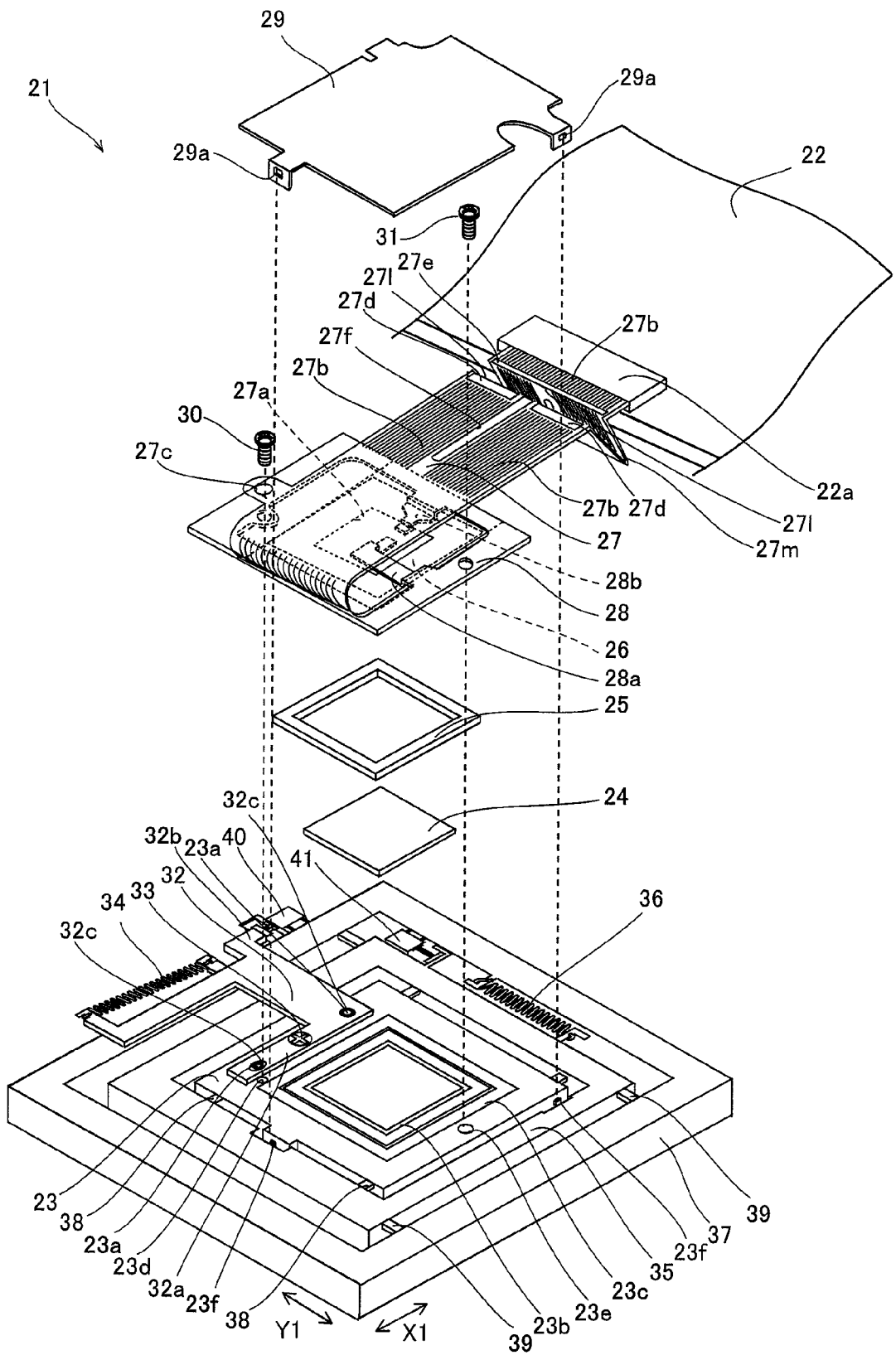
FIG. 4 is an exploded perspective view showing the imaging portion mounted with the circuit board through the FPC according to the embodiment of the present invention.

The holding member 28 of the imaging portion 21 has pressing portions 28a and 28b for holding the FPC while pressing the FPC 27 against the CCD 26 as shown in FIG. 4.

The pressing plate 29 of the imaging portion 21 is provided for pressing the FPC 27 from above in the X-Y stage 23 and has an engaging holes 29a engaging with the pawls 23f of the X-Y stage 23 as shown in FIG. 4.

Figure 3:
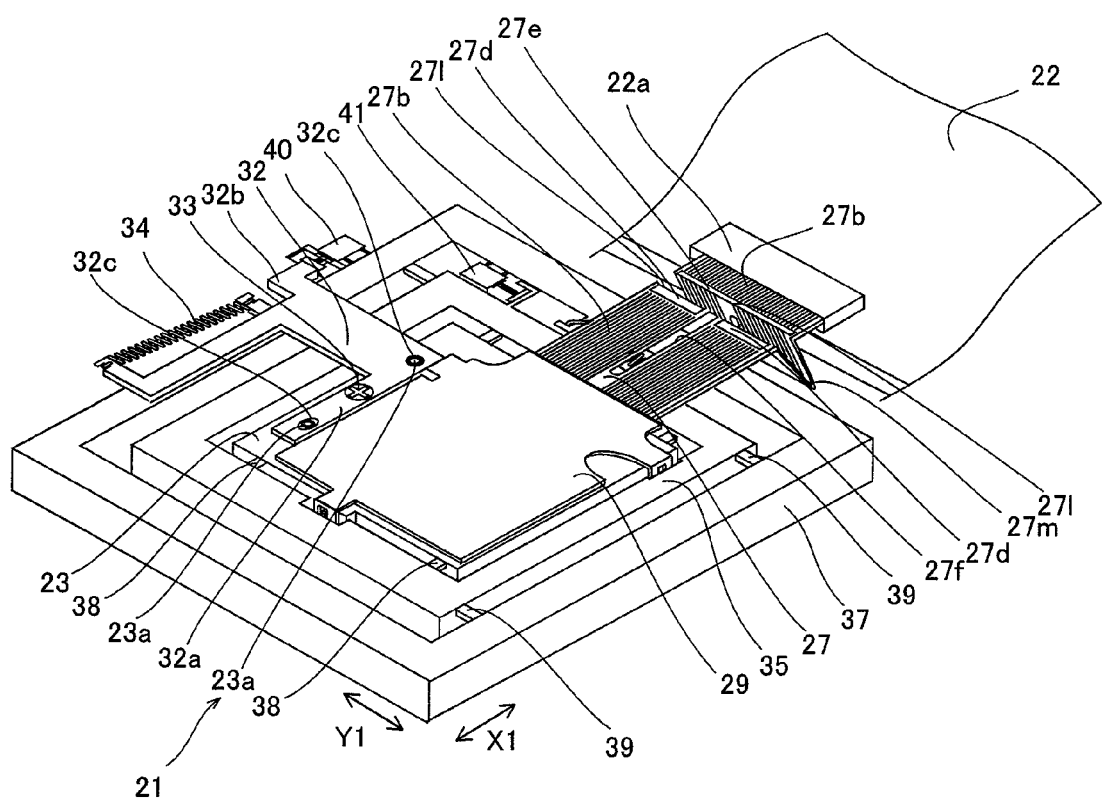
FIG. 3 is a perspective view showing an imaging portion mounted with a circuit board through an FPC according to the embodiment of the present invention.

The transmission arm member 32 of the imaging portion 21 has a mounting portion 32a mounted on the X-Y stage 23, a driving force transmission portion 32b for transmitting driving force from the stepping motor 40 to the X-Y stage 23 and two positioning holes 32c receiving the positioning boss portions 23a of the X-Y stage 23 as shown in FIGS. 3 to 5.

The Y stage 35 of the imaging portion 21 receives shafts 39 movable along arrow Y1 in the vicinity of both ends along arrow X1, as shown in FIG. 5.

The FPC 27 of the imaging portion 21 has a CCD mounting hole 27a provided on a mounting position of the CCD 26, signal lines 27b made of copper foil for transmitting a signal from the CCD 26 to the circuit board 22 and a screw receiving hole 27c for fixing the holding member 28 and the X-Y stage 23 by the screw member 30, as shown in FIGS. 7 to 10.

Figure 7:
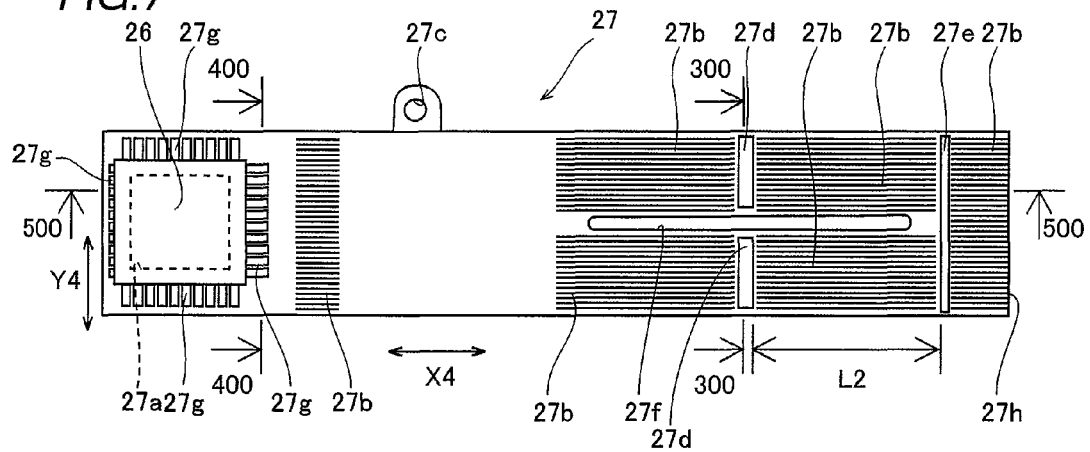
FIG. 7 is a plan view showing the FPC which is not folded and is connected with a CCD, according to the embodiment of the present invention.

According to this embodiment, the FPC 27 of the imaging portion 21 is further provided with positioning members 27d and 27e made of copper foil, a slit 27f, CCD connecting wires 27g made of copper foil for connecting the CCD 26 and the connecting terminal portion 27h for connecting the connector 22a of the circuit board 22, as shown in FIGS. 7 to 10. More specifically, the slit 27f is so provided at a substantial intermediate position in a short-side direction (along arrow Y4) of the FPC 27 as to extend from the vicinity of a location where the pressing plate 29 (see FIG. 4) of the imaging portion 21 is mounted to the vicinity of the positioning member 27e provided in the vicinity of the connecting terminal portion 27h in a direction (along arrow X4) of extension/contraction of the FPC 27, which is a longitudinal direction of the FPC 27, as shown in FIG. 7. In other words, the slit 27f is so formed as to extend over an extension/contraction region 27m described later and a region of the FPC 27 on a side opposite to the extension/contraction region 27m with respect to the positioning members 27d. The positioning member 27d is an example of the "first positioning member" in the present invention, and the positioning member 27e is an example of the "second positioning member" in the present invention.

Figure 8:
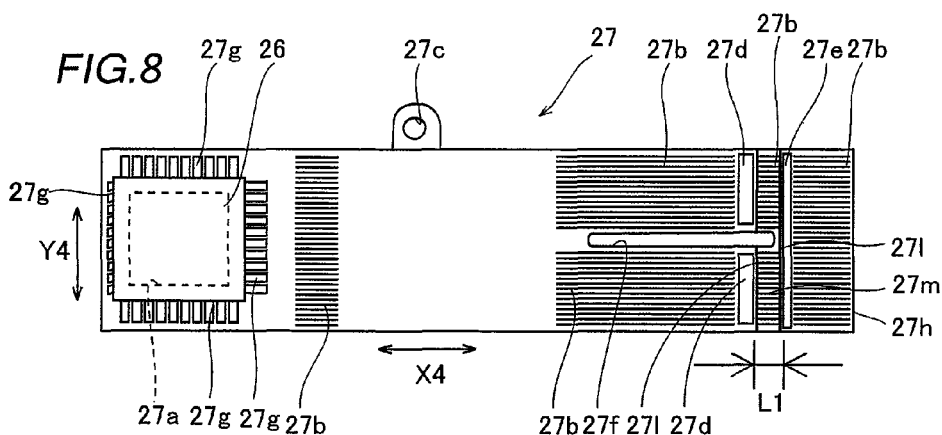
FIG. 8 is a plan view showing the FPC which is folded and is connected with the CCD, according to the embodiment of the present invention.
Figure 9:
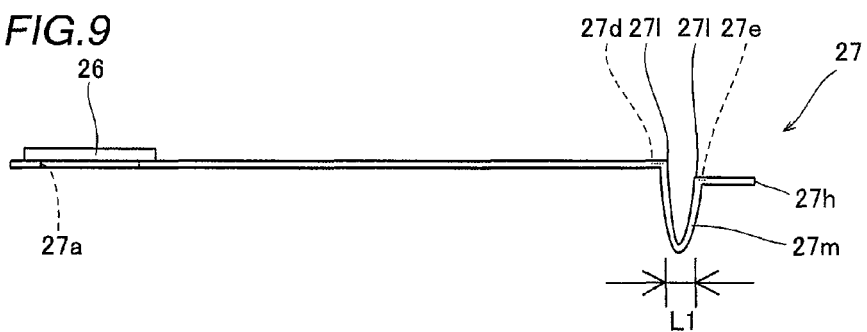
FIG. 9 is a side elevational view showing the FPC which is folded and is connected with the CCD, according to the embodiment of the present invention.
Figure 10:
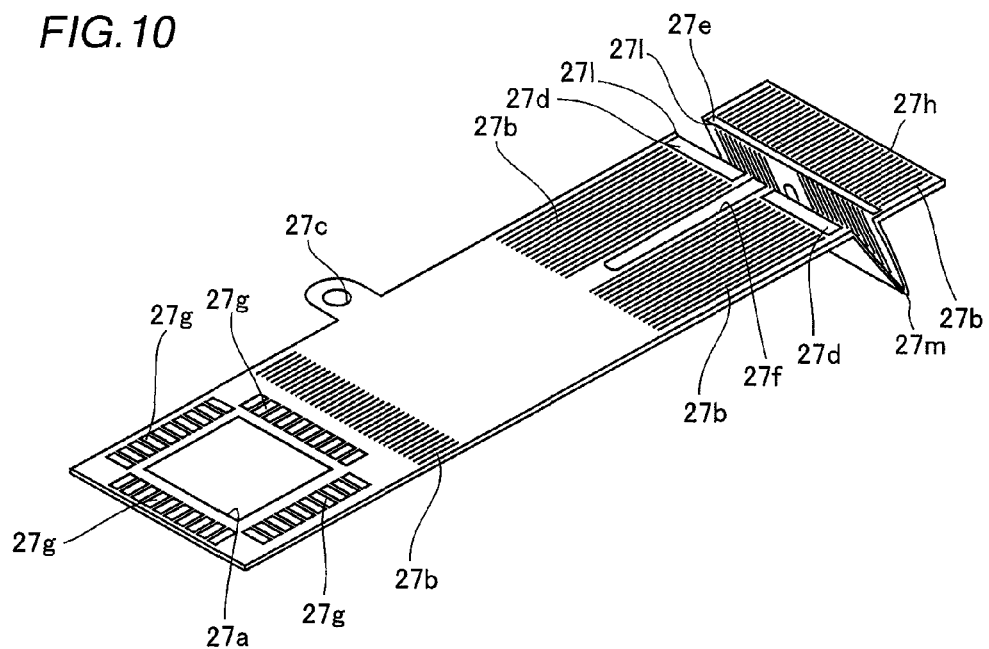
FIG. 10 is a perspective view showing the FPC which is folded, according to the embodiment of the present invention.

According to this embodiment, a pair of the positioning members 27d are so provided at the substantial intermediate position of the longitudinal direction (along arrow X4) of the slit 27f as to hold the slit 27f therebetween as shown in FIG. 7. The positioning member 27e is provided at a position in the vicinity of the connecting terminal portion 27h, as shown in FIG. 7. Each positioning member 27d is provided on a side connected to the CCD 26, and the positioning member 27e is provided on a side connected to the circuit board 22. The positioning members 27d and 27e are so provided on a side of the upper surface of the FPC 27 as to uniformly extend in the form of strips over a region between a portion around a first side surface of the FPC 27 in the short-side direction (along arrow Y4) of the FPC 27, which is a direction perpendicular to the extension/contraction direction (along arrow X4), and a second side surface thereof, as shown in FIGS. 7, 8 and 10. Widths of the positioning members 27d in the extension/contraction direction (along arrow X4) are rendered larger than that of the positioning member 27e in the extension/contraction direction (along arrow X4). The CCD connecting wire 27g is an example of the "wire" and the "terminal connecting wire portion" in the present invention.

The CCD mounting hole 27a and the CCD connecting wires 27g are provided on a first end of the FPC 27 and the connecting terminal portion 27h is a provided on a second end of the FPC 27, as shown in FIGS. 7 to 10.

Figure 11:
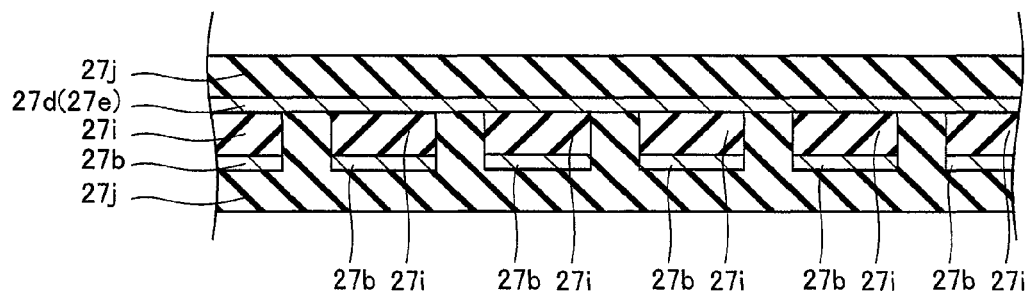
FIG. 11 is a sectional view taken along the line 300-300 in FIG. 7, showing the FPC according to the embodiment of the present invention.

According to this embodiment, on portions where the positioning members 27d and 27e of the FPC 27 are provided, the positioning members 27d and 27e are provided on sides opposite to the signal lines 27b so as to hold insulating layers 27i made of polyimide between the positioning members 27d and 27e and the signal lines 27b, as shown in FIG. 11. In other words, the positioning members 27d and 27e are formed on upper surfaces of the insulating layers 27i and the signal lines 27b are formed on lower surfaces of the insulating layers 27i. Thus, the positioning members 27d and 27e are insulated from the signal lines 27b and CCD connecting wires 27g by the insulating layers 27i and an insulating member 27j transmitting light. The positioning members 27d and 27e provided on lower portions of the insulating member 27j are visually recognizably provided. Another insulating member 27j is so formed on surfaces of the positioning members 27d and 27e as to cover the positioning members 27d and 27e.

Figure 12:
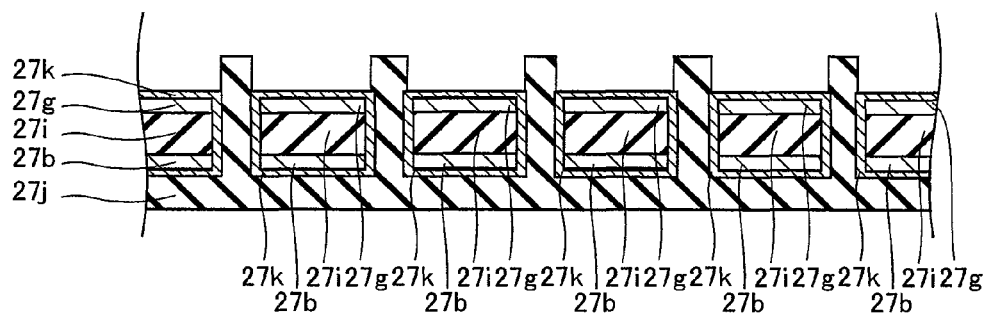
FIG. 12 is a sectional view taken along the line 400-400 in FIG. 7, showing the FPC according to the embodiment of the present invention.
Figure 13:
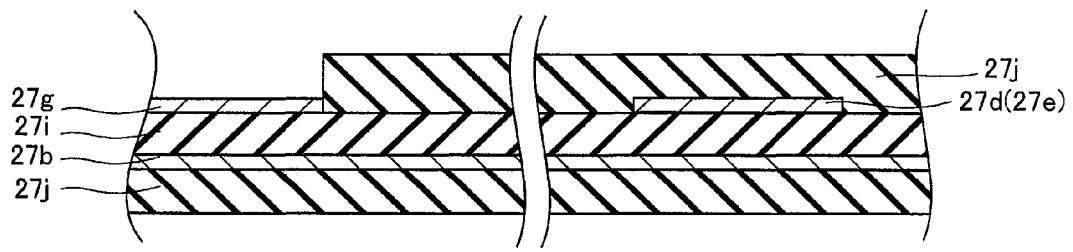
FIG. 13 is a sectional view taken along the line 500-500 in FIG. 7, showing the FPC according to the embodiment of the present invention.
Figure 14:
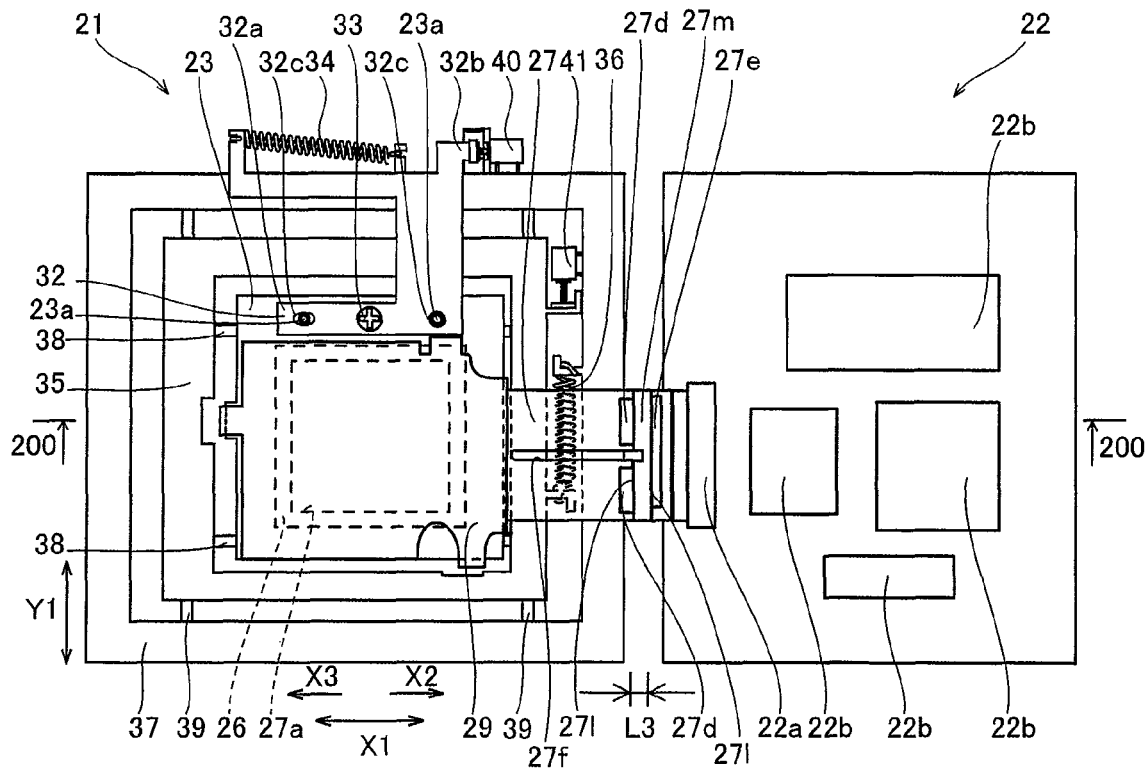
FIG. 14 is a plan view showing the imaging portion mounted with the circuit board through the FPC when the an X-Y stage moves along arrow X2, according to the embodiment of the present invention.
Figure 15:
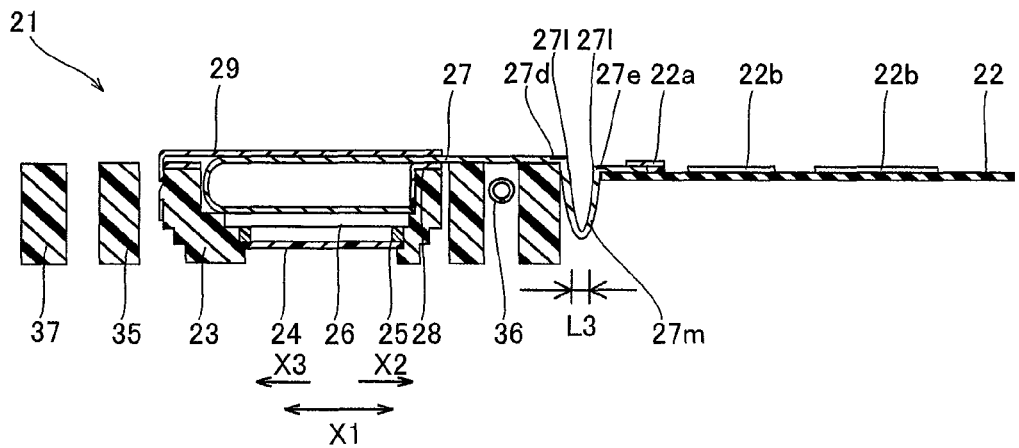
FIG. 15 is a sectional view taken along the line 200-200 in FIG. 14, showing the imaging portion mounted with the circuit board through the FPC when the X-Y stage moves along arrow X2, according to the embodiment of the present invention.
Figure 16:
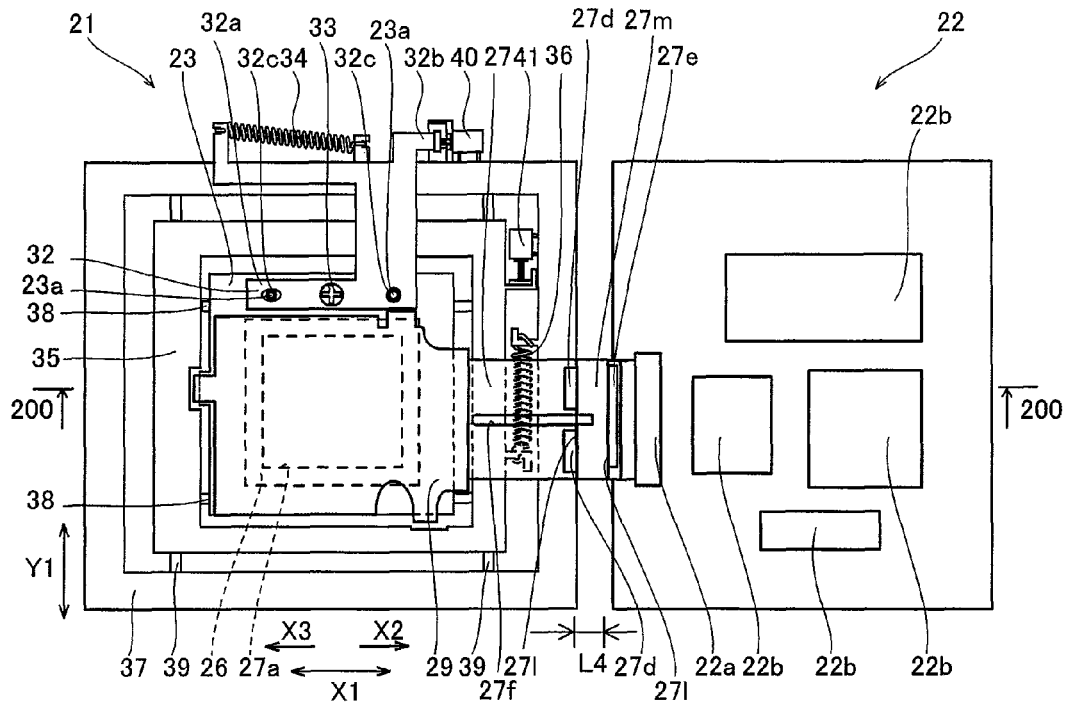
FIG. 16 is a plan view showing the imaging portion mounted with the circuit board through the FPC when the X-Y stage moves along arrow X3, according to the embodiment of the present invention.
Figure 17:
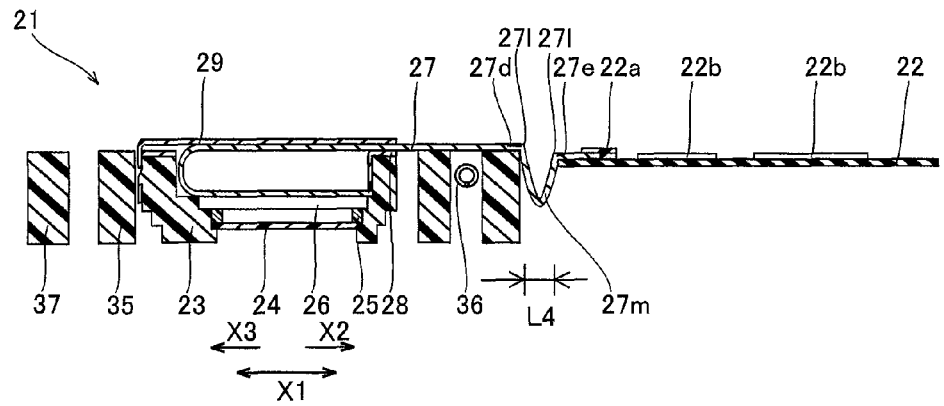
FIG. 17 is a sectional view taken along the line 200-200 in FIG. 16, showing the imaging portion mounted with the circuit board through the FPC when the X-Y stage moves along arrow X3, according to the embodiment of the present invention.

According to this embodiment, the CCD connecting wires 27g are connected to the signal lines 27b by plating layers 27k having conductivity, as shown in FIG. 12. The insulating members 27j provided above the CCD connecting wires 27g are removed in order to connect the CCD connecting wires 27g and terminals of the CCD 26. Consequently, image signals obtained by the CCD 26 are transmitted to the integrated circuits 22b through the CCD connecting wires 27g, the signal lines 27b and the connecting terminal portion 27h of the FPC 27 and the connector 22a of the circuit board 22. The CCD connecting wires 27g are so provided as to formed by the same layer as the positioning members 27d and 27e as shown in FIG. 13. The insulating member 27j is an example of the "protective film" in the present invention.

According to this embodiment, the extension/contraction region 27m which has folded portions 27l so provided on both ends thereof adjacent to the positioning members 27d and 27e as to extend along arrow Y1 and is formed in a substantially V-shape by being folded with reference to the positioning members 27d and 27e is provided on the FPC 27 of the imaging portion 21, as shown in FIG. 8. Thus, positioning members 27d and 27e are formed at positions in contact with the folded portions 27l of the extension/contraction region 27m, and are so formed as to be located outside the extension/contraction region 27m. A planar length of a portion constituting the extension/contraction region 27m in the extension/contraction direction (along arrow X4) is reduced from a length L2 to a length L1 by folding the portion to form in the substantially V-shape, as shown in FIGS. 7 and 8. The extension/contraction region 27m is so provided as to extend and contract by the change of a distance between both ends of the substantially V-shape according to movement of the X-Y stage 23 mounted with the CCD 26. The folded portion 27l is an example of the "end of an extension/contraction region" in the present invention.

A camera shake correcting operation of the imaging portion 21 mounted with the circuit board 22 through the FPC 27 and an extending/contracting operation of the FPC 27 according to the embodiment of the present invention will be now described with reference to FIGS. 5, 6, 14 to 17.

When the imaging portion 21 and the circuit board 22 move along arrow X3 by movement of the video camera 10 by camera shake from a state where no displacement is applied to the X-Y stage 23 in FIGS. 5 and 6, the stepping motor 40 senses the movement to move the transmission arm member 32 and the X-Y stage 23 fixed to the transmission arm member 32 along arrow X2, namely in a direction (to counteract the camera shake) opposite to the direction along arrow X3 which is a direction of the camera shake. Thus, the CCD 26 provided on the X-Y stage 23 moves to a corrected position, and hence the camera shake is corrected. In this embodiment, the FPC 27 provided on the X-Y stage 23 is connected to the fixed the circuit board 22, and hence a distance between the FPC 27 and the circuit board 22 is reduced as a distance between the X-Y stage 23 and the circuit board 22 is reduced. Thus, the extension/contraction region 27m of the FPC 27 is so contracted as to reduce the distance between the X-Y stage 23 and the circuit board 22. Thus, a planar length L3 of the extension/contraction region 27m in the extension/contraction direction (along arrow X1) is smaller than the planar length L1 of the extension/contraction region 27m in the extension/contraction direction (along arrow X1) in the state where no displacement is applied to the X-Y stage 23, as shown in FIGS. 5, 6, 14 and 15.

When the imaging portion 21 and the circuit board 22 move along arrow X2, the stepping motor 40 senses the movement to move the transmission arm member 32 and the X-Y stage 23 fixed to the transmission arm member 32 along arrow X3, namely in a direction (to counteract the camera shake) opposite to the direction along arrow X2 which is a direction of the camera shake. Thus, the CCD 26 provided on the X-Y stage 23 moves to a corrected position, whereby the camera shake is corrected. In this embodiment, the FPC 27 provided on the X-Y stage 23 is connected with the fixed circuit board 22, and hence the distance between the FPC 27 and the circuit board 22 is increased as a distance between the X-Y stage 23 and the circuit board 22 is increased. Thus, the extension/contraction region 27m of the FPC 27 is so extended as to increase the distance between the X-Y stage 23 and the circuit board 22. Thus, a planar length L4 of the extension/contraction region 27m in the extension/contraction direction (along arrow X1) is larger than the planar length L1 of the extension/contraction region 27m in the extension/contraction direction (along arrow X1) in the state where no displacement is applied to the X-Y stage, as shown in FIGS. 5, 6, 16 and 17.

According to this embodiment, as hereinabove described, the video camera 10 comprises the FPC 27 including the visually recognizable positioning members 27d and 27e provided on the upper surface of the FPC 27 and the extension/contraction region 27m formed by being folded with reference to the positioning members 27d and 27e, whereby the FPC 27 can be folded with reference to the visually recognizable positioning members 27d and 27e, and hence the folded portions 27l can be easily positioned. Additionally, the folded portions 27l provided on the both ends of the extension/contraction region 27m, which are located on the positioning members 27d and 27e respectively, are folded, whereby the extension/contraction region 27m of the FPC 27 can be further apparent. Thus, the movable region of the FPC 27 can be properly secured, and hence the camera shake correction of the video camera 10 can be properly performed.

According to this embodiment, as hereinabove described, the positioning members 27d and 27e are so formed as to extend in the direction (along arrow Y1) perpendicular to the direction along arrow X1 which is the extension/contraction direction of the extension/contraction region 27m, whereby the folded portions 27l can be so provided as to extend along arrow Y1 by folding the FPC 27 with reference to the positioning members 27d and 27e. Thus, the extension/contraction region 27m of the FPC 27 can be extended/contracted only along arrow X1 which is a movement direction of the FPC 27. Consequently, the FPC 27 can be moved only along arrow X1 which is the extension/contraction direction by extending/contracting the extension/contraction region 27m of the FPC 27 only in a movement direction of the X-Y stage 23, and hence the camera shake correction of the video camera 10 can be properly performed.

According to this embodiment, as hereinabove described, the positioning members 27d and 27e are so formed as to extend over the region between the portion around the first side surface of the FPC 27 and the portion around the second side surface thereof, whereby the positioning members 27d and 27e are substantially entirely provided adjacent to the folded portions 27l, and hence the FPC 27 can be further easily folded with reference to the positioning members 27d and 27e. Consequently, the folded portions 27l of the FPC 27 can be further easily positioned.

According to this embodiment, as hereinabove described, the positioning members 27d and 27e are formed by the same layer as the CCD connecting wires 27g, whereby the CCD connecting wires 27g of the FPC 27 are provided when fabricating the FPC 27 while the positioning members 27d and 27e are also simultaneously provided.

According to this embodiment, the positioning members 27d and 27e are made of copper foil so that the CCD connecting wires 27g and the signal lines 27b of the FPC 27 are made of copper foil, and hence the positioning members 27d and 27e can be easily formed by leaving the conductive layers on the locations where the positioning members 27d and 27e are formed when etching the conductive layers made of copper foil previously provided to form the CCD connecting wires 27g and the signal lines 27b.

According to this embodiment, as hereinabove described, the positioning members 27d and 27e are provided on one side of the FPC 27, whereby the signal lines 27b of the FPC 27 can be provided on positions, corresponding to the positioning members 27d and 27e, of a surface on a side opposite to the one side on which the positioning members 27d and 27e are provided, and hence the folded portions 27l can be positioned without damaging a wire function of the FPC 27.

According to this embodiment, as hereinabove described, the slit 27f is so provided at the substantial intermediate position in the short-side direction (along arrow Y4) of the FPC 27 as to extend from the vicinity of the location, where the pressing plate 29 of the imaging portion 21 is mounted, to the vicinity of the positioning member 27e provided in the vicinity of the connecting terminal portion 27h in a longitudinal direction (along arrow X4) of the FPC 27, whereby the load resistance in extension of the extension/contraction region 27m of the FPC 27 can be reduced, and hence reduction in a reaction rate of the camera shake correction of the video camera 10 can be suppressed. The FPC 27 on a portion where the slit 27f is provided is removed, and hence a load resistance by movement of along arrow Y1 is applied to a region of the FPC 27 between the location, where the pressing plate 29 of the imaging portion 21 is mounted, and the extension/contraction region 27m can be reduced. The first end of the FPC 27 connected to the CCD 26 is moved in the extension/contraction direction (along arrow X4) by extension/contraction of the extension/contraction region 27m as compared with the second end of the FPC 27 connected to the fixed circuit board 22, and hence the load resistance following to the deformation in extension/contraction of the FPC 27 can be further reduced.

According to this embodiment, as hereinabove described, the pair of positioning members 27d are so provided at the substantial intermediate position of the longitudinal direction (along arrow X4) of the slit 27f as to hold the slit 27f therebetween, whereby the FPC 27 can be reliably folded by the pair of positioning members 27d also when the slit 27f is provided.

According to this embodiment, as hereinabove described, the pair of positioning members 27d and the positioning member 27e are so formed in the form of strips as to extend in the direction (along arrow Y4) perpendicular to the extension/contraction direction of the extension/contraction region 27m respectively, and the width of each of the pair of positioning members 27d is rendered larger than that of the positioning member 27e, whereby the folded portions 27l in forming the extension/contraction region 27m can be easily confirmed due to difference in widths between each of the pair of positioning members 27d and the positioning member 27e. The width of each of the pair of positioning members 27d is increased so that intensity of each of the pair of positioning members 27d is increased, and hence even the pair of positioning members 27d formed so as to hold the slit 27f therebetween can be easily correctly folded.

According to this embodiment, as hereinabove described, the extension/contraction region 27m is formed in the substantially V-shape as viewed from the side surface of the FPC 27 and the positioning members 27d and 27e are provided on the both ends of the extension/contraction region 27m, whereby the load resistance in extending/contracting the extension/contraction region 27m formed in a substantially triangular shape (substantially V-shape) as viewed from the side surface can be reduced as compared with a case of an extension/contraction region formed in a substantially square shape as viewed from the side surface, and hence reduction in a reaction rate of the camera shake correction of the video camera 10 can be suppressed.

According to this embodiment, as hereinabove described, the positioning members 27d and 27e are so formed as to be located outside the extension/contraction region 27m, whereby the load resistance in extending/contracting the extension/contraction region 27m of the FPC 27 can be inhibited from increase due to formation of the positioning members 27d and 27e in the extension/contraction region 27m.

According to this embodiment, as hereinabove described, the insulating member 27j of polyimide which is formed on the surface of the FPC 27 so as to cover the positioning members 27d and 27e and through which the positioning members 27d and 27e can be visually recognized is provided, whereby the positioning members 27d and 27e can be visually recognized due to the insulating member 27j through which the positioning members 27d and 27e are visually recognized, and the positioning members 27d and 27e and the wires (signal lines 27b) and the like inside the FPC 27 can be reliably protected from external environment. Further, insulation between the positioning members 27d and 27e and the wires (signal lines 27b) inside the FPC 27 can be kept.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment is applied to the video camera 10 employed as an exemplary image sensor according to the present invention, the present invention is not restricted to this but is also applicable to an image sensor other than the video camera.

While the FPC 27 is so provided as to move along arrow X1 (see FIG. 5 and the like) in the aforementioned embodiment, the present invention is not restricted to this but the FPC may be so provided as to move along arrow Y1 (see FIG. 5 and the like).

While the signal lines 27b, the positioning members 27d and 27e and the CCD connecting wires 27g of the FPC 27 are made of copper foil in the aforementioned embodiment, the present invention is not restricted to this but the signal lines 27b, the positioning members 27d and 27e and the CCD connecting wires 27g of the FPC 27 may be made of a conductive material such as gold, for example.

While the extension/contraction region 27m is formed in the substantially V-shape as viewed from the side surface of the FPC 27 in the aforementioned embodiment, the present invention is not restricted to this but the extension/contraction region 27m may be formed in a substantial U-shape or a substantial W-shape.

While the positioning members 27d and 27e of the FPC 27 is so provided as to uniformly extend over the region between the portion around the first side surface of the FPC 27 and the portion around the second side surface thereof in the aforementioned embodiment, the present invention is not restricted to this but a plurality of positioning members may be provided at a constant interval, for example.

What is claimed is:

1. An image sensor comprising:
an imaging element for imaging an object;
a movable member mounted with said imaging element and movably provided;
a flexible printed circuit board having a portion on a side of a first end connected to said imaging element, and including a visually recognizable positioning member provided at least on a side of an upper surface and an extension/contraction region formed by folding said flexible printed circuit board with reference to said positioning member; and
a circuit board connected with a portion on a side of a second end of said flexible printed circuit board and fixedly set,
wherein said positioning member includes a first positioning member provided on an end of said extension/contraction region corresponding to the portion on the side of said first end of said flexible printed circuit board connected to said imaging element and a second positioning member provided on an end of said extension/contraction region corresponding to the portion on the side of said second end of said flexible printed circuit board connected to said circuit board.

2. The image sensor according to claim 1, wherein
said positioning member is so provided as to extend in a direction perpendicular to an extension/contraction direction of said extension/contraction region in plan view.

3. The image sensor according to claim 1, wherein
said positioning member is so provided as to extend over a region between a portion around a first side surface of said flexible printed circuit board and a portion around a second side surface thereof.

4. The image sensor according to claim 1, wherein
said positioning member is formed by the same layer as a wire of said flexible printed circuit board.

5. The image sensor according to claim 4, wherein
said flexible printed circuit board includes a terminal connecting wire portion connected to a terminal of said imaging element and having an exposed surface, and
said positioning member is formed by the same layer as said terminal connecting wire portion.

6. The image sensor according to claim 4, wherein said positioning member is made of metal foil.

7. The image sensor according to claim 6, wherein said positioning member is made of copper foil.

8. The image sensor according to claim 1, wherein said positioning member is provided on one side of said flexible printed circuit board.

9. The image sensor according to claim 1, wherein
said first positioning member and said second positioning member are so formed as to extend in a direction substantially perpendicular to an extension/contraction direction of said extension/contraction region, and a width of said first positioning member is rendered larger than that of said second positioning member.

10. The image sensor according to claim 1, wherein
said flexible printed circuit board further has a slit, and
said slit is so provided on at least folded said extension/contraction region as to extend along an extension/contraction direction of said extension/contraction region.

11. The image sensor according to claim 10, wherein
said slit is so formed at a substantially central portion of said flexible printed circuit board in a direction perpendicular to the extension/contraction direction of said extension/contraction region as to extend along the extension/contraction direction of said extension/contraction region.

12. The image sensor according to claim 10, wherein a pair of said first positioning members are so formed as to hold said slit therebetween.

13. The image sensor according to claim 10, wherein said slit is so formed as to extend from said extension/contraction region to a region other than said extension/contraction region.

14. The image sensor according to claim 13, wherein
said slit is so formed as to extend from said extension/contraction region of said flexible printed circuit board to a region of said flexible printed circuit board on a side opposite to said extension/contraction region with respect to said first positioning member.

15. The image sensor according to claim 1, wherein
said extension/contraction region is formed in a substantially V-shape as viewed from a side surface of said flexible printed circuit board, and said positioning member is provided on each of both ends of said substantially V-shaped extension/contraction region.

16. The image sensor according to claim 1, wherein
said positioning member is so formed as to be in contact with an end of said extension/contraction region and to be located outside said extension/contraction region.

17. The image sensor according to claim 1, wherein
said flexible printed circuit board further includes a protective film which is formed on a surface of said flexible printed circuit board so as to cover said positioning member and through which said positioning member can be visually recognized.

18. The image sensor according to claim 17, wherein said protective film is made of polyimide.

* * * * *